(12) United States Patent
Lozhkin

(10) Patent No.: US 11,196,537 B2
(45) Date of Patent: Dec. 7, 2021

(54) WIRELESS COMMUNICATION APPARATUS AND COEFFICIENT UPDATE METHOD

(71) Applicant: FUJITSU LIMITED, Kawasaki (JP)

(72) Inventor: Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/122,229

(22) Filed: Dec. 15, 2020

(65) Prior Publication Data
US 2021/0258139 A1    Aug. 19, 2021

(30) Foreign Application Priority Data

Feb. 18, 2020    (JP) .............................. JP2020-025291

(51) Int. Cl.
| | | |
|---|---|---|
| *H03F 1/32* | (2006.01) | |
| *H04L 7/00* | (2006.01) | |
| *H04B 1/04* | (2006.01) | |

(52) U.S. Cl.
CPC ......... *H04L 7/0091* (2013.01); *H04B 1/0475* (2013.01); *H04L 7/0025* (2013.01); *H03F 1/3247* (2013.01); *H04B 2001/0408* (2013.01)

(58) Field of Classification Search
CPC .. H03F 1/3247; H03F 3/24; H03F 2201/3233; H03F 2200/451; H03F 1/3258;
(Continued)

(56) References Cited

U.S. PATENT DOCUMENTS

| | | | |
|---|---|---|---|
| 8,558,615 B2 * | 10/2013 | Li ......................... | H03F 1/3247 330/149 |
| 10,763,905 B1 * | 9/2020 | Luo ....................... | H04L 1/0071 |

(Continued)

FOREIGN PATENT DOCUMENTS

| | | |
|---|---|---|
| JP | 2001-189685 A | 7/2001 |
| JP | 2006-080931 A | 3/2006 |
| JP | 2011-019029 A | 1/2011 |

OTHER PUBLICATIONS

Altera, "Digital Predistortion Reference Design", Application Note AN-314-1.0, Altera Corporation, Jul. 2003, pp. 1-46 (Total 46 pages).

(Continued)

*Primary Examiner* — Eva Y Puente
(74) *Attorney, Agent, or Firm* — Fujitsu Patent Center

(57) ABSTRACT

A wireless communication apparatus includes: a processor that performs distortion compensation on a transmission signal by using a distortion compensation coefficient; an amplifying unit that amplifies the transmission signal; and a feedback path that feeds back a feedback signal to the processor. The processor executes a process including: acquiring, from a transmission signal at a first timing and feedback signals at a second timing that is before the first timing and at a third timing that is after the first timing, instantaneous delay associated with propagation delay of the feedback signals in the feedback path; calculating a mean value of the instantaneous delay acquired in a predetermined time period; adding delay associated with the calculated mean value to the transmission signal; and updating the distortion compensation coefficient by using the transmission signal to which the delay is added and the feedback signal.

7 Claims, 9 Drawing Sheets

(58) Field of Classification Search
CPC .. H03F 3/245; H03F 2201/3224; H03F 3/189; H03F 3/19; H03F 2200/336; H03F 1/3241; H03F 1/0222; H04B 1/0475; H04B 2001/0425; H04B 2001/0408; H04B 1/0007; H04B 1/3822; H04B 1/40; H04B 1/525; H04B 1/1036; H04B 2001/1063; H04B 1/04; H04B 1/0483; H04B 1/18; H04B 14/06; H04L 1/0071; H04L 27/368; H04L 1/0041; H04L 1/0057; H04L 25/0398; H04L 27/2657; H04L 27/2695; H04L 25/03343; H04L 27/0002; H04L 27/2656; H04L 1/0045; H04L 5/0091
USPC .................................. 375/296, 329; 330/149
See application file for complete search history.

(56) References Cited

U.S. PATENT DOCUMENTS

| | | |
|---|---|---|
| 2001/0005402 A1 | 6/2001 | Nagatani et al. |
| 2006/0056536 A1 | 3/2006 | Hori et al. |
| 2006/0088125 A1* | 4/2006 | Miyatani ................... H04L 5/06 375/296 |
| 2017/0279470 A1* | 9/2017 | Lee .......................... H03F 3/195 |
| 2018/0175808 A1* | 6/2018 | Ota ........................ H03F 1/3247 |

OTHER PUBLICATIONS

Sangil Lee et al., "Digital Predistortion for Power Amplifiers in Hybrid MIMO Systems with Antenna Subarrays", 2015 IEEE 81st Vehicular Technology Conference (VTC Spring) (Total 5 pages).

* cited by examiner

WIRELESS COMMUNICATION APPARATUS AND COEFFICIENT UPDATE METHOD

CROSS-REFERENCE TO RELATED APPLICATION(S)

This application is based upon and claims the benefit of priority of the prior Japanese Patent Application No. 2020-025291, filed on Feb. 18, 2020, the entire contents of which are incorporated herein by reference.

FIELD

The embodiments discussed herein are related to a wireless communication apparatus and a coefficient update method.

BACKGROUND

In recent years, there is a growing need for power amplifiers operated with high efficiency from the viewpoint of downsizing wireless communication apparatuses, a reduction in operational costs, and environmental issues. When a power amplifier is operated with high efficiency, in an area in which input electrical power is relatively high, an input signal is not subjected to linear amplification and nonlinear distortion is generated at the time of output from the power amplifier. Thus, an amplification method that uses digital predistortion (DPD) in which distortion having inverse characteristics of nonlinear distortion generated in the power amplifier is previously added to transmission signals is sometimes used. The distortion that is previously added to the transmission signals in DPD is also called a distortion compensation coefficient and is read from a lookup table (LUT) or is calculated by using a polynomial equation. Then, the distortion compensation coefficient is appropriately updated in order to sufficiently compensate nonlinear distortion that varies in accordance with an environment, such as a temperature.

In order to update the distortion compensation coefficient, transmission signals before amplification performed by the power amplifier and feedback signals that are fed back after amplification performed by the power amplifier are used. Specifically, for example, Least Means Square (LMS) algorithm or the like is used and the distortion compensation coefficient is calculated such that an error between the transmission signal and the feedback signal is the minimum. At this time, an error $\varepsilon(n)$ is represented by an Equation (1) below, where the transmission signal at a timing n is denoted by $x(n)$ and the feedback signal is denoted by $y(n)$.

$$\varepsilon(n) = x(n) - y(n) \quad (1)$$

Here, when a transfer function of the power amplifier is denoted by $F(x)$, because a propagation delay $\tau$ is added to the feedback signal $y(n)$ in a feedback path, the feedback signal $y(n)$ is represented by Equation (2) below.

$$y(n) = F\{x(n-\tau)\} \quad (2)$$

Namely, the feedback signal $y(n)$ at the timing n is obtained by amplifying the transmission signal $x(n-\tau)$ at a timing $(n-\tau)$ that is before the timing n by the power amplifier. Accordingly, if an error is calculated by Equation (1) without considering the propagation delay $\tau$, an error between signals that are originally different is calculated, and thus, the distortion compensation coefficient is not accurately updated. Therefore, the timing of the transmission signal and the timing of the feedback signal are sometimes aligned by adding the same delay as the propagation delay of the feedback signal to the transmission signal. Specifically, for example, an error $\varepsilon(n-\tau)$ is calculated by using Equation (3) below.

$$\varepsilon(n-\tau) = x(n-\tau) - y(n) \quad (3)$$
$$= x(n-\tau) - F\{x(n-\tau)\}$$

According to Equation (3) above, because both of the transmission signal and the feedback signal used for calculating the error are associated with the transmission signal at the timing $(n-\tau)$, an error between two signals that are originally the same is calculated. Consequently, by calculating a distortion compensation coefficient that minimizes the error, it is possible to accurately update the distortion compensation coefficient.

Incidentally, in order to add the same delay as the propagation delay of the feedback signal to the transmission signal, for example, low-pass filters are sometimes used. Specifically, transmission signals are subjected to filtering by a plurality of low-pass filters each having different amount of delay to be added, a correlation between a transmission signal and a feedback signal after the filtering is calculated, and a low-pass filter that outputs the transmission signal having the maximum correlation with the feedback signal is selected. After this, by filtering the transmission signal using the selected low-pass filter, it is possible to add the same delay as the propagation delay of the feedback signal to the transmission signal.

Patent Document 1: Japanese Laid-open Patent Publication No. 2011-019029
Patent Document 2: Japanese Laid-open Patent Publication No. 2001-189685
Patent Document 3: Japanese Laid-open Patent Publication No. 2006-080931
Non-Patent Document 1: Altera, "Digital Predistortion Reference Design", Altera Application Note AN-314-1, July, 2003

However, there is a problem in that an amount of computation is increased when the timing of the transmission signal and the timing of the feedback signal are aligned by adding delay to the transmission signal. Namely, in order to add the same delay as the propagation delay of the feedback signal to the transmission signal, correlation computation between the transmission signal that has been subjected to filtering by the plurality of low-pass filters and the feedback signal is performed. Accordingly, correlation computation is performed on each of outputs of the plurality of low-pass filters, and thus, an amount of computation is increased. Furthermore, because the transmission signal is a complex signal, two low-pass filters associated with an in-phase (I) component and a quadrature (Q) component are used for a single transmission signal. Consequently, the number of low-pass filters is increased and thus an amount of computation of correlation computation is increased in accordance with the number of low-pass filters.

In particular, in a case of a wireless communication apparatus that transmits signals from a plurality of antennas, a power amplifier is provided in association with each of the antennas, and feedback paths from the corresponding power amplifiers are different. Thus, propagation delay of the feedback signals related to the corresponding power amplifiers are different and a large amount of correlation computation is performed in order to calculate an amount of delay that is added to the transmission signal.

Furthermore, after low-pass filters are selected by performing correlation computation, delay is fixedly added to the transmission signal by using the selected low-pass filter; however, when propagation delay varies in the feedback path, erroneous delay is added to the transmission signal. Namely, if delay is simply added to the transmission signal by using the low-pass filter, there is also a problem in that it is difficult to adapt a change in environment.

SUMMARY

According to an aspect of an embodiment, a wireless communication apparatus includes: a processor that performs distortion compensation on a transmission signal by using a distortion compensation coefficient; an amplifying unit that amplifies the transmission signal subjected to the distortion compensation by the processor; and a feedback path that feeds back a signal output from the amplifying unit to supply a feedback signal to the processor. The processor executes a process including: acquiring, from a transmission signal at a first timing and feedback signals at a second timing that is before the first timing and at a third timing that is after the first timing, instantaneous delay associated with propagation delay of the feedback signals in the feedback path; calculating a mean value of the instantaneous delay acquired in a predetermined time period; adding delay associated with the calculated mean value to the transmission signal; and updating the distortion compensation coefficient by using the transmission signal to which the delay is added and the feedback signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The present invention is not limited to the embodiments.

[a] First Embodiment

Figure 1:
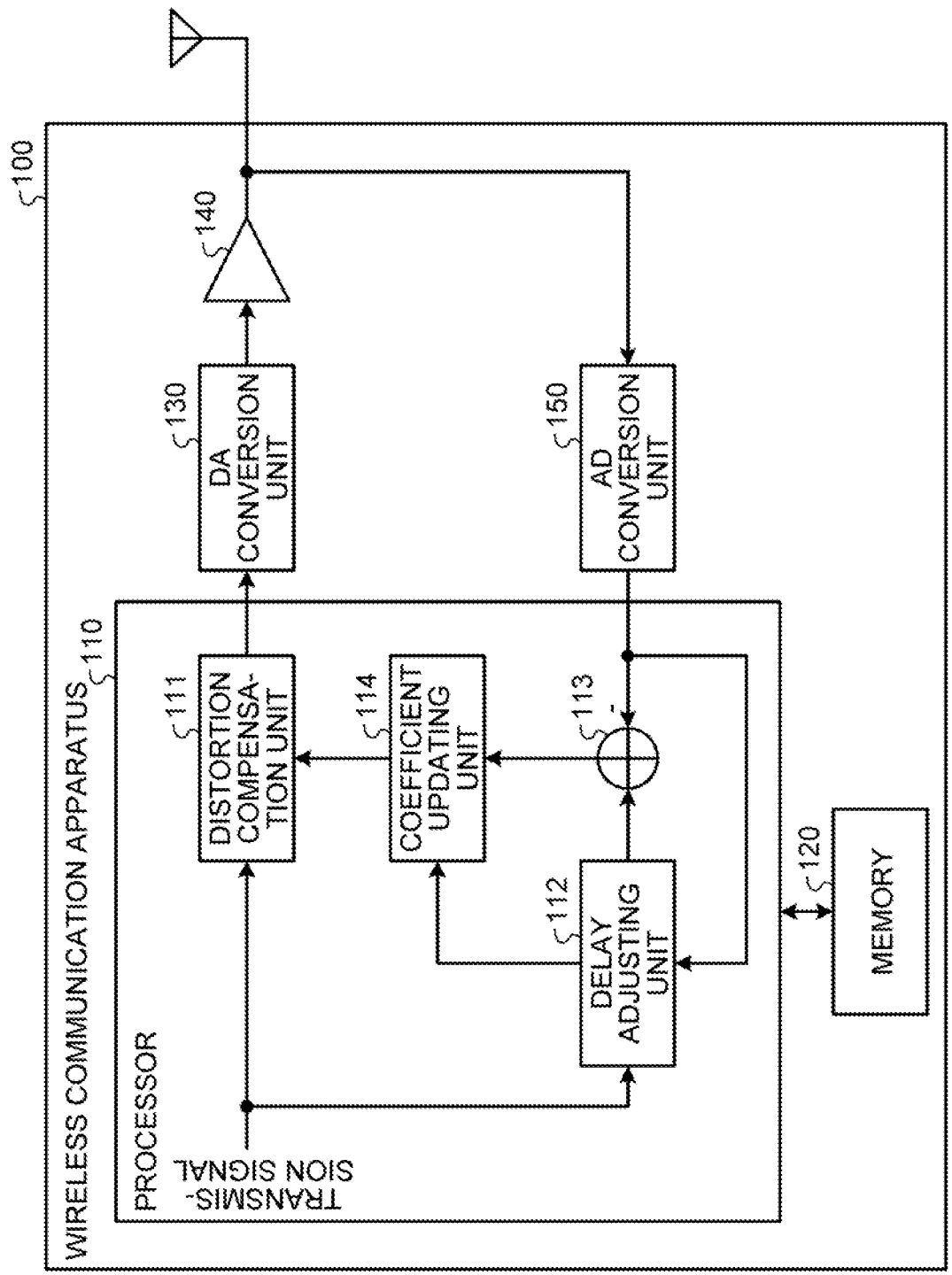
FIG. 1 is a block diagram illustrating a configuration of a wireless communication apparatus according to a first embodiment.

FIG. 1 is a block diagram illustrating a configuration of a wireless communication apparatus 100 according to a first embodiment. The wireless communication apparatus 100 illustrated in FIG. 1 includes a processor 110, a memory 120, a digital-to-analog (DA) conversion unit 130, a power amplifier 140, and an analog-to-digital (AD) conversion unit 150.

The processor 110 includes, for example, a central processing unit (CPU), a field programmable gate array (FPGA) or a digital signal processor (DSP), and performs overall control of the wireless communication apparatus 100. Specifically, the processor 110 includes a distortion compensation unit 111, a delay adjusting unit 112, an error calculating unit 113, and a coefficient updating unit 114.

The distortion compensation unit 111 holds a lookup table (LUT) that stores therein distortion compensation coefficients in accordance with electrical power of, for example, transmission signals and performs distortion compensation on the transmission signals by using the distortion compensation coefficients read from the LUT. Namely, the distortion compensation unit 111 performs a distortion compensation process on the transmission signals by multiplying a distortion compensation coefficient that is distortion having an inverse characteristic of the nonlinear distortion generated in the power amplifier 140 by the transmission signal. The distortion compensation unit 111 outputs the transmission signal that has been subjected to distortion compensation to the DA conversion unit 130.

The delay adjusting unit 112 adds the same delay as the propagation delay, in a feedback path, of a feedback signal (hereinafter, simply referred to as an "FB signal") that is fed back from the power amplifier 140 to the transmission signal. Namely, by adding delay to the transmission signal, the delay adjusting unit 112 aligns the timings of the transmission signal and the FB signal that are input to the error calculating unit 113. At this time, the delay adjusting unit 112 calculates an amount of delay of the propagation delay of FB signals by discriminating, based on a sample of the transmission signal at the timing n and a sample of FB signals at the timings that are before and after the timing n (for example, a timing (n−1) and a timing (n+1)), delay (hereinafter, referred to as "instantaneous delay") in a sample of the transmission signal at the timing n and averaging the instantaneous delay in a predetermined time period. Then, the delay adjusting unit 112 adds the delay corresponding to the calculated amount of delay to the transmission signal. The delay adjusting unit 112 outputs the transmission signal (delay transmission signal) to which the delay has been added to the error calculating unit 113. Furthermore, after elapse of convergence period of time before the amount of delay to be calculated stably converges, the delay adjusting unit 112 notifies the coefficient updating unit 114 of update permission indicating permission to update the distortion compensation coefficient. Furthermore, a configuration of the delay adjusting unit 112 will be described in detail later.

The error calculating unit 113 calculates an error between the delay transmission signal in which the delay has been added by the delay adjusting unit 112 and the FB signal.

Namely, the error calculating unit 113 calculates an error between the transmission signal and the FB signal both of which have the aligned timings. Then, the error calculating unit 113 outputs the calculated error to the coefficient updating unit 114.

When the coefficient updating unit 114 receives a notification of the update permission from the delay adjusting unit 112, the coefficient updating unit 114 acquires the error calculated by the error calculating unit 113 and updates the distortion compensation coefficient. At this time, the coefficient updating unit 114 updates the distortion compensation coefficient that is associated with the delay transmission signal in which delay is added by the delay adjusting unit 112. Namely, because the distortion compensation unit 111 holds the LUT that stores therein distortion compensation coefficients in accordance with electrical power of, for example, transmission signals, the coefficient updating unit 114 updates the distortion compensation coefficient that is stored in accordance with the electrical power of the delay transmission signal.

The memory 120 includes for example, a random access memory (RAM), a read only memory (ROM), or the like and stores various kinds of information when a process is performed by the processor 110.

The DA conversion unit 130 performs DA conversion on the transmission signal that has been subjected to distortion compensation and that is output from the processor 110 and then outputs the obtained analog transmission signal to the power amplifier 140.

The power amplifier 140 amplifies the transmission signal. The transmission signal amplified by the power amplifier 140 is transmitted via an antenna. When the power amplifier 140 amplifies the transmission signal, nonlinear distortion in accordance with input electrical power is generated. However, because the transmission signal is previously subjected to distortion compensation, the nonlinear distortion generated in the power amplifier 140 is canceled out. Consequently, nonlinear distortion of the transmission signal is reduced at the time of output from the power amplifier 140 and it is thus possible to suppress unneeded emission of an adjacent band.

The AD conversion unit 150 feeds back the transmission signal amplified by the power amplifier 140 and performs AD conversion on the FB signal. Then, the AD conversion unit 150 outputs the obtained digital FB signal to the processor 110. The path that is connected to the processor 110 via the AD conversion unit 150 from the output end of the power amplifier 140 forms a feedback path that supplies the FB signal to the processor 110.

Figure 2:
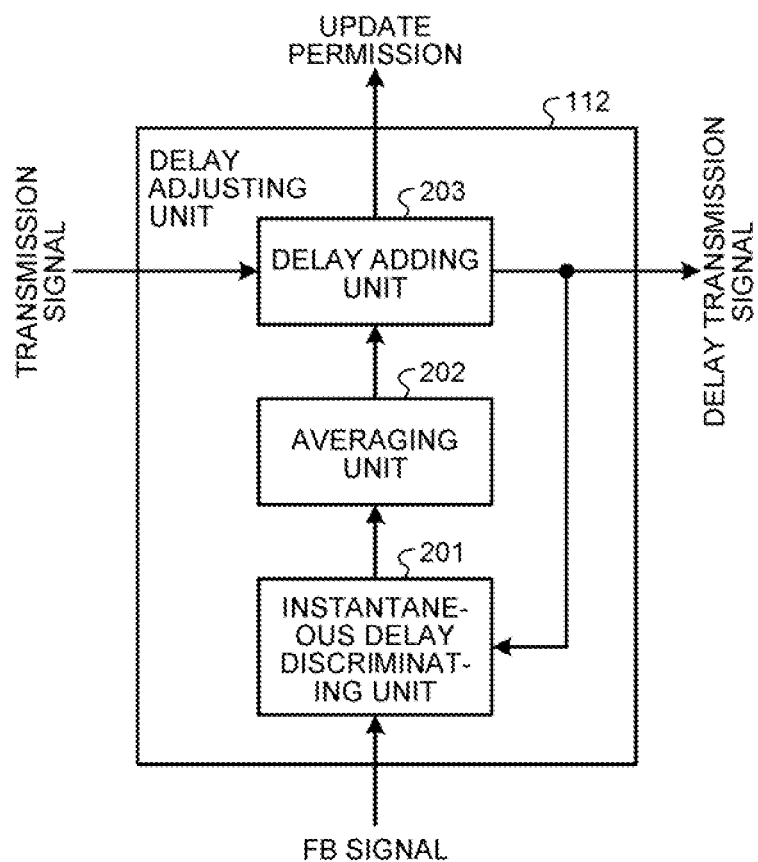
FIG. 2 is a block diagram illustrating a configuration of a delay adjusting unit.

FIG. 2 is a block diagram illustrating a configuration of the delay adjusting unit 112. As illustrated in FIG. 2, the delay adjusting unit 112 includes an instantaneous delay discriminating unit 201, an averaging unit 202, and a delay adding unit 203.

The instantaneous delay discriminating unit 201 discriminates the instantaneous delay corresponding to a delay difference between the delay transmission signal and the FB signals based on a sample of the delay transmission signal that is output from the delay adding unit 203 at a certain timing n and a sample of the FB signals that are fed back at the timings that are before and after the timing n (for example, the timing (n−1) and the timing (n+1)). Specifically, the instantaneous delay discriminating unit 201 calculates an instantaneous discriminant value indicating which of the samples of the FB signals at the timings between the timings before and after the timing n is closer to the sample of the delay transmission signal at the timing n.

Figure 3:
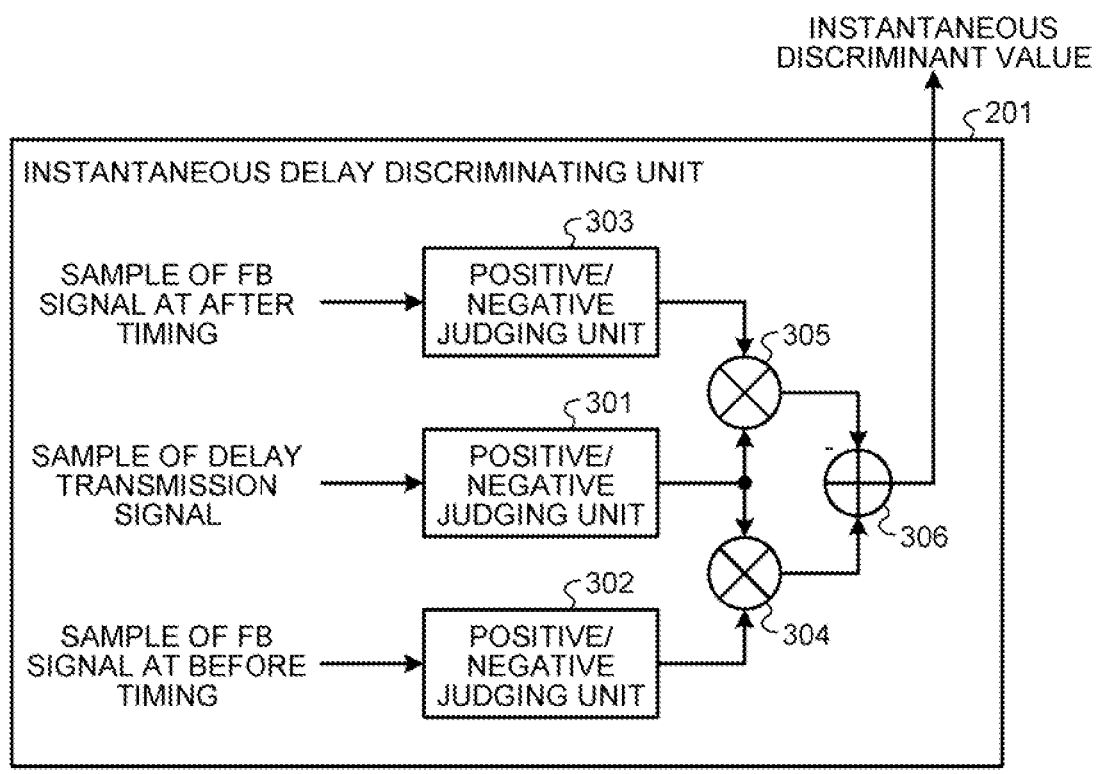
FIG. 3 is a block diagram illustrating a specific example of an instantaneous delay discriminating unit.

FIG. 3 is a block diagram illustrating a specific example of the instantaneous delay discriminating unit 201. The instantaneous delay discriminating unit 201 illustrated in FIG. 3 includes a positive/negative judging units 301 to 303, multipliers 304 and 305, and a subtracter 306.

The positive/negative judging unit 301 judges whether the sample of the delay transmission signal that is output from the delay adding unit 203 at the timing n is positive or negative. Then, when the sample of the delay transmission signal is positive, the positive/negative judging unit 301 outputs +1, whereas, in a case of negative, the positive/negative judging unit 301 outputs −1.

The positive/negative judging unit 302 judges whether the sample of the FE signal at the timing that is before the timing n (for example, the timing (n−1) that is one clock before the timing n) is positive or negative. Then, when the sample of the FB signal is positive, the positive/negative judging unit 302 outputs +1, whereas, in a case of negative, the positive/negative judging unit 302 outputs −1.

The positive/negative judging unit 303 judges whether the sample of the FB signal at the timing that is after the timing n (for example, the timing (n+1) that is one clock after the timing n) is positive or negative. Then, when the sample of the FB signal is positive, the positive/negative judging unit 303 outputs +1, whereas, in a case of negative, the positive/negative judging unit 303 outputs −1.

The multiplier 304 multiplies an output of the positive/negative judging unit 301 by an output of the positive/negative judging unit 302 and then outputs the multiplication result to the subtracter 306. Namely, the multiplier 304 outputs, to the subtracter 306, the multiplication result indicating a correlation between the sample of the delay transmission signal at the timing n and the sample of the FB signal at the timing that is before the timing n (for example, timing (n−1)).

The multiplier 305 multiplies an output of the positive/negative judging unit 301 by an output of the positive/negative judging unit 303 and then outputs the multiplication result to the subtracter 306. Namely, the multiplier 305 outputs, to the subtracter 306, the multiplication result indicating a correlation between the sample of the delay transmission signal at the timing n and the sample of the FB signal at the timing that is after the timing n (for example, the timing (n+1)).

The subtracter 306 subtracts the multiplication result obtained by the multiplier 305 from the multiplication result obtained by the multiplier 304 and then outputs the subtraction result as an instantaneous discriminant value. Namely, the subtracter 306 outputs an instantaneous discriminant value indicating which of the samples of the FB signals at the timings between the timings before and after the timing n is closer to the sample of the delay transmission signal at the timing n.

Figure 4:
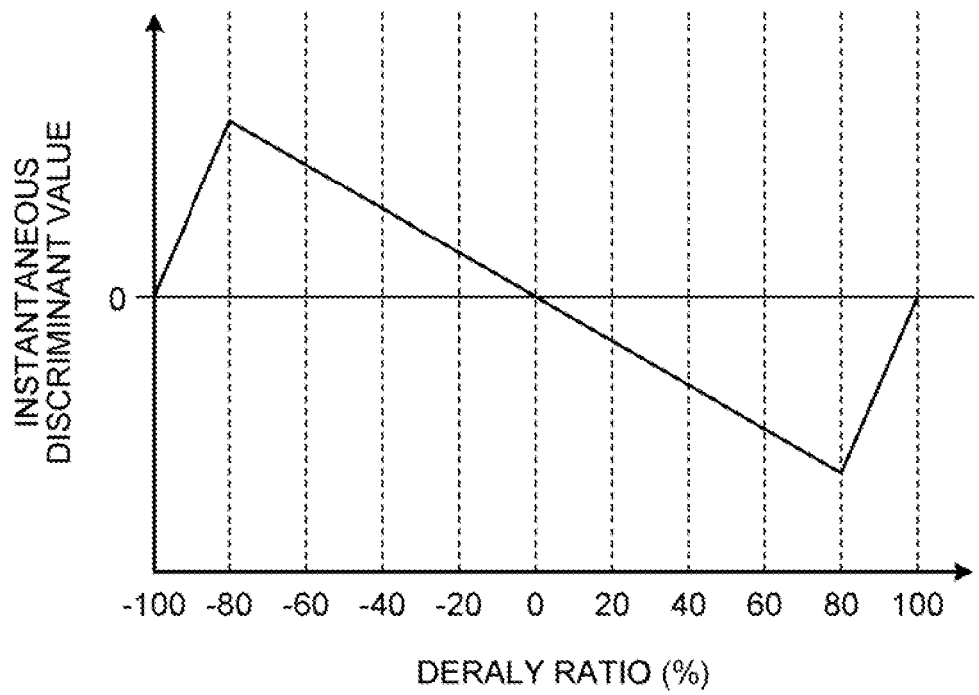
FIG. 4 is a diagram illustrating a specific example of a transfer function of the instantaneous delay discriminating unit.

A specific example of the transfer function of the instantaneous delay discriminating unit 201 is illustrated in FIG. 4. In FIG. 4, the horizontal axis indicates a ratio of the delay difference of the delay transmission signal to the FB signal with respect to one clock and the vertical axis indicates an expected value of the instantaneous discriminant value that is output from the instantaneous delay discriminating unit 201. As illustrated in FIG. 4, an absolute value of the expected value of the instantaneous discriminant value increases as the absolute value of the delay difference increases; however, when the delay difference is zero or when the delay difference equal to one clock, the expected value of the instantaneous discriminant value becomes zero.

Furthermore, here, it is assumed that the positive/negative judging units 301 to 303 judge whether the samples of the delay transmission signal and the FB signals are positive or negative and the multipliers 304 and 305 obtain a correlation from the sign of positive/negative. However, a correlation may also be obtained from the samples themselves of the delay transmission signal and the FB signals. Namely, it may also possible to obtain a correlation value between the sample of the delay transmission signal at the timing n and the sample of the FB signal at the timing that is before the timing n and it may also possible to obtain a correlation value between the sample of the delay transmission signal at the timing n and the sample of the FB signal at the timing that is after the timing n. Then, the difference between these correlation values may also be used as an instantaneous discriminant value.

The averaging unit 202 calculates a mean value of the instantaneous discriminant values calculated during a predetermined time period by the instantaneous delay discriminating unit 201. The mean value of the instantaneous discriminant values calculated by the averaging unit 202 corresponds to the delay difference between the delay transmission signal and the FB signal. Consequently, the averaging unit 202 notifies the delay adding unit 203 of the calculated mean value as an amount of delay that is to be added to the delay transmission signal.

Figure 5:
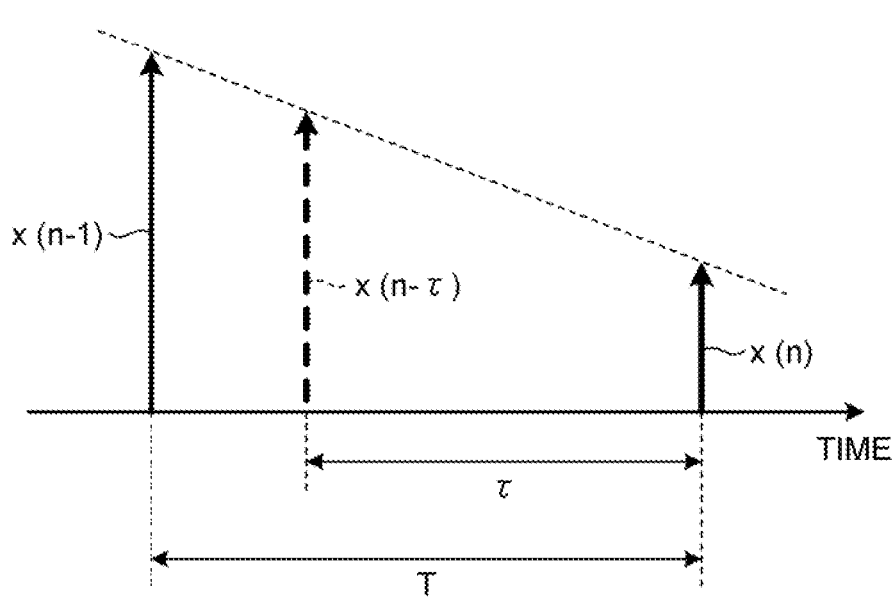
FIG. 5 is a diagram illustrating a specific example of adding delay.

The delay adding unit 203 adds the delay of the amount of delay notified from the averaging unit 202 to the transmission signal and outputs the delay transmission signal to the error calculating unit 113. Specifically, the delay adding unit 203 adds the delay that is less than one clock to the transmission signal by using, for example, Lagrange interpolation. Namely, for example, as illustrated in FIG. 5, when the amount of delay notified from the averaging unit 202 is T, based on a sample x(n) of the transmission signal at the timing n and a sample x(n−1) of the transmission signal at the timing (n−1) that is before time T corresponding to one clock, a sample x(n−τ) that is delayed by an amount of delay τ from the timing n is calculated by Equation (4) below.

$$x(n-\tau) \approx x(n-1) + \frac{T-\tau}{T} \cdot (x(n) - x(n-1)) \quad (4)$$

Furthermore, when the delay adding unit 203 is outputting the delay transmission signal by already adding the delay τ to the transmission signal, if delay τ' is notified from the averaging unit 202, the delay adding unit 203 adds delay (τ+τ') that is the sum total of these pieces of delay to the transmission signal.

Furthermore, after calculation of an amount of delay has been started by the instantaneous delay discriminating unit 201 and the averaging unit 202, and after elapse of predetermined convergence period of time until the amount of delay notified from the averaging unit 202 stably converges, the delay adding unit 203 notifies the coefficient updating unit 114 of update permission indicating permission to update the distortion compensation coefficient. Furthermore, because the distortion compensation coefficient updated by the coefficient updating unit 114 is the distortion compensation coefficient associated with the electrical power of the delay transmission signal, the delay adding unit 203 may also output the delay transmission signal to the coefficient updating unit 114.

Figure 6:
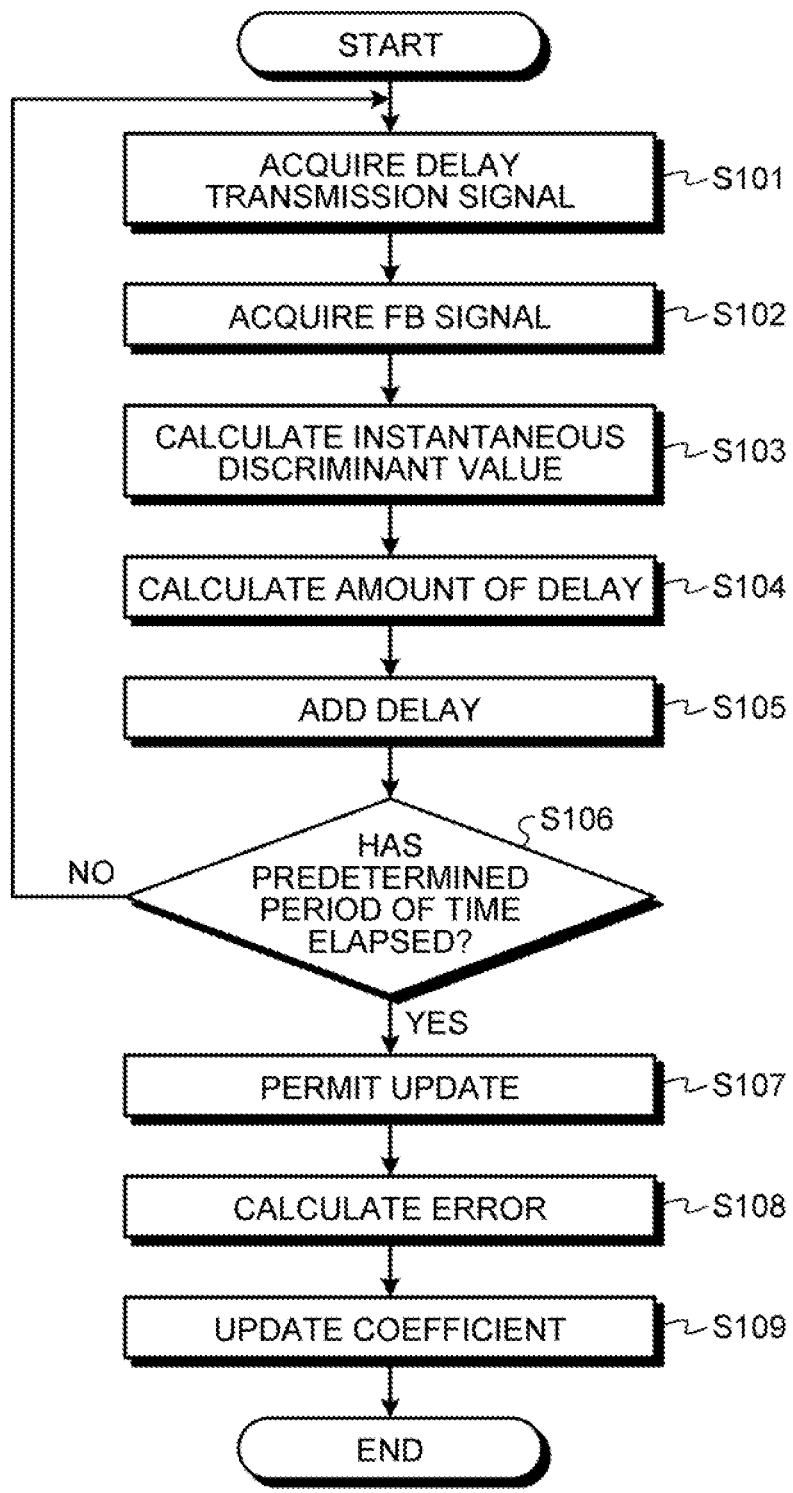
FIG. 6 is a flowchart illustrating a coefficient update method according to the first embodiment.

In the following, a coefficient update method performed in the wireless communication apparatus 100 configured described above will be described with reference to the flowchart illustrated in FIG. 6.

At the time of starting up the wireless communication apparatus 100, the delay transmission signal output from the delay adding unit 203 is acquired by the instantaneous delay discriminating unit 201 (Step S101). In the initial state, because the delay added to the transmission signal by the delay adding unit 203 is zero, the delay transmission signal equal to the transmission signal is acquired by the instantaneous delay discriminating unit 201.

Furthermore, when the transmission signal is subjected to distortion compensation by the distortion compensation unit 111 and is amplified by the power amplifier 140, the FB signal that is fed back from the power amplifier 140 is acquired by the instantaneous delay discriminating unit 201 (Step S102).

Then, an instantaneous discriminant value is calculated from the sample of the delay transmission signal and the sample of the FB signals by the instantaneous delay discriminating unit 201 (Step S103). Specifically, the instantaneous discriminant value illustrated in, for example, FIG. 3 is calculated from the sample of the delay transmission signal that is output from the delay adding unit 203 at the certain timing n and the sample of the FB signal that is fed back at the timings before and after the timing n (for example, the timing (n−1) and the timing (n+1)).

The calculated instantaneous discriminant values are accumulated by the averaging unit 202 and the mean value of the instantaneous discriminant values accumulated in a predetermined time period is calculated as an amount of delay (Step S104). The calculated amount of delay is notified to the delay adding unit 203 and delay is added to the transmission signal by the delay adding unit 203 (Step S105). Namely, the delay that is less than one clock is added to the transmission signal by, for example, Lagrange interpolation and the timings of the FB signals in which propagation delay is generated in the feedback path and the delay transmission signal are aligned.

Furthermore, after the wireless communication apparatus 100 is started up by the delay adding unit 203, it is determined whether a predetermined convergence period of time for which an amount of delay calculated by the instantaneous delay discriminating unit 201 and the averaging unit 202 stably converges has elapsed (Step S106). When the predetermined convergence period of time has not elapsed (No at Step S106), calculation of the amount of delay described above is repeated.

In contrast, after the wireless communication apparatus 100 is started up, when the predetermined convergence period of time has elapsed (Yes at Step S106), the update permission indicating permission to update the distortion compensation coefficient is notified from the delay adding unit 203 to the coefficient updating unit 114 (Step S107). Consequently, after the notification of the update permission, an update of the distortion compensation coefficient is performed by the coefficient updating unit 114. Namely, an error between the delay transmission signal and the FB signals is calculated by the error calculating unit 113 (Step S108), and a distortion compensation coefficient that reduces the error is calculated by the coefficient updating unit 114. This distortion compensation coefficient is stored in, for example, the LUT held by the distortion compensation unit 111 and an update of the distortion compensation coefficient is performed (Step S109).

After the start of updating the distortion compensation coefficient, calculation of an amount of delay performed by the instantaneous delay discriminating unit 201 and the averaging unit 202 may also be stopped; however, it is preferable that an amount of delay is periodically calculated by the instantaneous delay discriminating unit 201 and the averaging unit 202. Consequently even when the propagation delay of the FB signal is changed due to, for example, a change in environment, it is possible to add the delay corresponding to the propagation delay to the transmission signal.

As described above, according to the embodiment, by calculating an instantaneous discriminant value from the sample of the transmission signal at a certain timing and the sample of the FB signals at the timings that are before and after the certain timing and by calculating a mean value of the instantaneous discriminant values in a predetermined time period, an amount of delay that is added to the transmission signal is calculated. Consequently, it is possible to add the delay corresponding to the propagation delay of the FB signal to the transmission signal without performing correlation computation or the like associated with a plurality of low-pass filters and it is thus possible to reduce an amount of computation at the time of adding delay to the signals. Furthermore, because the delay corresponding to the propagation delay of the FB signals is calculated by using the transmission signal and the FB signals and is added to the transmission signal, even when the propagation delay of the FB signals is changed due to a change in, for example, environment, it is possible to appropriately add the delay corresponding to the propagation delay to the transmission signal.

[b] Second Embodiment

The characteristic of a second embodiment is that, when a power amplifier associated with each of a plurality of antennas is provided, feedback paths from the corresponding power amplifiers are switched and delay corresponding to propagation delay for each feedback path is added to the transmission signal.

Figure 7:
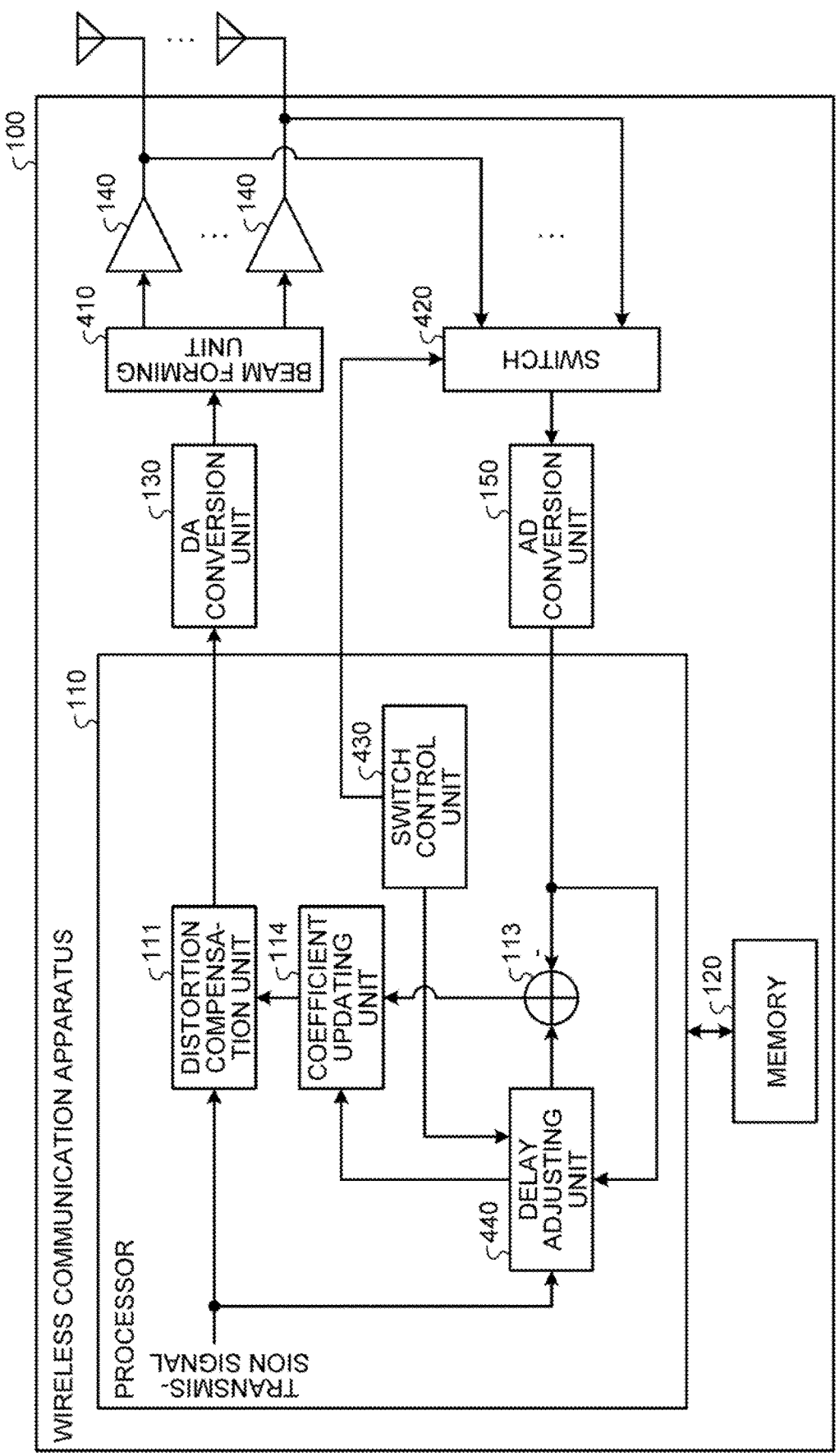
FIG. 7 is a block diagram illustrating a configuration of a wireless communication apparatus according to a second embodiment.

FIG. 7 is a block diagram illustrating a configuration of the wireless communication apparatus 100 according to the second embodiment. In FIG. 7, components that are the same as those illustrated in FIG. 1 are assigned the same reference numerals and descriptions thereof will be omitted. The wireless communication apparatus 100 illustrated in FIG. 7 has a configuration in which, when compared with the wireless communication apparatus 100 illustrated in FIG. 1, a plurality of the power amplifiers 140 associated with a plurality of antennas is included and a beam forming unit 410 and a switch 420 are added. Furthermore, the processor 110 illustrated in FIG. 7 includes, instead of the delay adjusting unit 112 included in the processor 110 illustrated in FIG. 1, a switch control unit 430 and a delay adjusting unit 440.

The beam forming unit 410 forms beams having directivity in a desired direction by splitting the transmission signal in accordance with the plurality of antennas and by multiplying a weighting factor by each of the split transmission signals. Each of the split transmission signals is amplified by the power amplifiers 140 that are provided for each antenna, is transmitted from the corresponding antennas, and is fed back via each of the corresponding feedback paths.

The switch 420 switches the feedback paths associated with the plurality of corresponding antennas in time series in accordance with control of the switch control unit 430 and sequentially outputs the FB signals received from the corresponding feedback paths to the AD conversion unit 150.

The switch control unit 430 instructs the switch 420 to switch the feedback paths associated with the plurality of corresponding antennas every predetermined time. Furthermore, the switch control unit 430 notifies the delay adjusting unit 440 of an antenna instruction indicating which antenna associated with feedback path is used by the switch 420 to output the FB signal. Namely, the switch control unit 430 notifies the delay adjusting unit 440 that which of the FB signals received from the feedback paths is to be input to the error calculating unit 113.

The delay adjusting unit 440 adds, to the transmission signal, the same delay as the propagation delay in the feedback path of the FB signal that is fed back from the power amplifier 140. Namely, by adding the delay to the transmission signal, the delay adjusting unit 440 aligns the timings of the transmission signal and the FB signals that are input to the error calculating unit 113. At this time, the delay adjusting unit 440 calculates, based on the antenna instruction notified from the switch control unit 430, the propagation delay of the FB signals that are different for each feedback path and stores the calculated propagation delay in association with the antennas. Then, when the delay adjusting unit 440 calculates propagation delay of the FB signal next time, the delay adjusting unit 440 reads, based on the antenna instruction, the propagation delay that is stored and associated with the antenna and calculates new propagation delay by using the stored propagation delay associated with the antenna as an initial value.

The delay adjusting unit 440 calculates an amount of delay of the propagation delay of the FB signal by discriminating the instantaneous delay of the sample of the transmission signal at the timing n based on the sample of the transmission signal at the timing n and the sample of the FB signals at the timings before and after the timing n (for example, the timing (n−1) and the timing (n+1)) and by averaging the instantaneous delay in a predetermined time period. Then, the delay adjusting unit 440 adds the delay corresponding to the calculated amount of delay to the transmission signal. Furthermore, after elapse of convergence period of time until the amount of delay to be calculated stably converges, the delay adjusting unit 440 notifies the coefficient updating unit 114 of the update permission indicating permission to update the distortion compensation coefficient.

Figure 8:
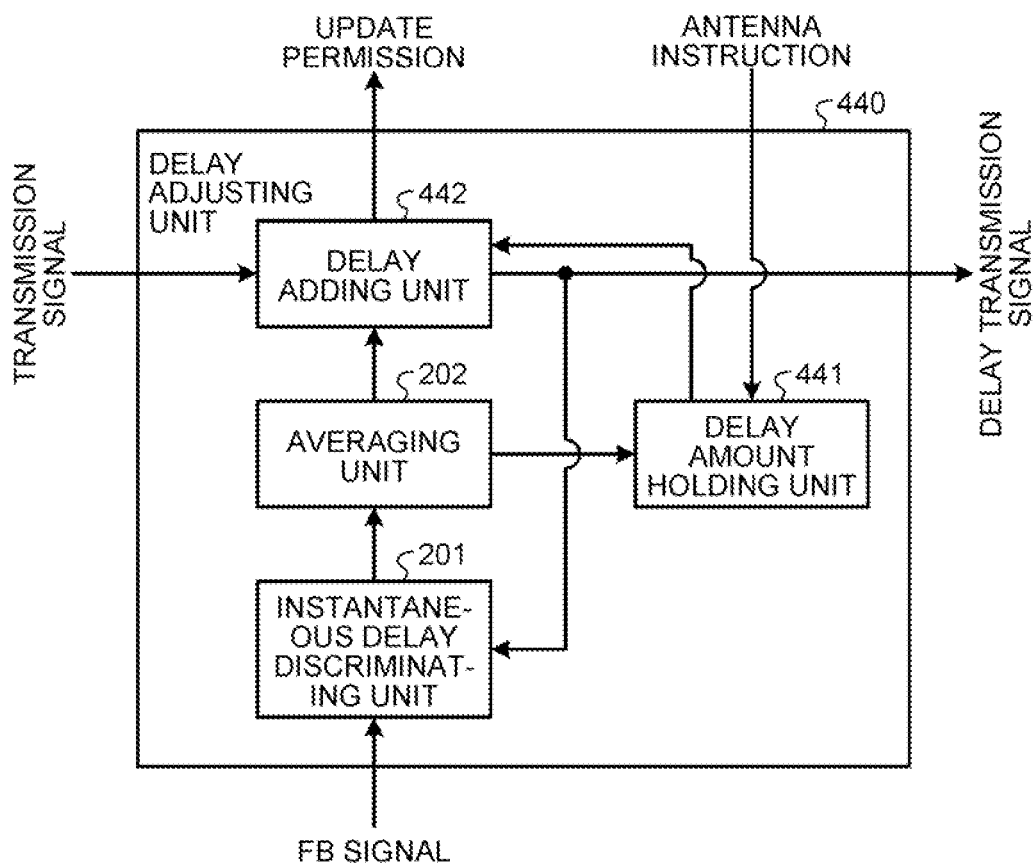
FIG. 8 is a block diagram illustrating a configuration of a delay adjusting unit.

FIG. 8 is a block diagram illustrating a configuration of the delay adjusting unit 440. In FIG. 8, components that are the same as those illustrated in FIG. 2 are assigned the same reference numerals and descriptions thereof will be omitted. The delay adjusting unit 440 illustrated in FIG. 8 includes a delay amount holding unit 441 and a delay adding unit 442 instead of the delay adding unit 203 included in the delay adjusting unit 112 illustrated in FIG. 2.

The delay amount holding unit 441 stores therein an amount of delay of the delay that is calculated by the averaging unit 202 and that is added to the transmission signal by associating the amount of delay with each of the antennas. Namely, the delay amount holding unit 441 acquires the antenna instruction from the switch control unit 430 and stores the amount of delay calculated by the averaging unit 202 by associating the amount of delay with the feedback path that is currently selected. Furthermore, when the delay amount holding unit 441 acquires the antenna instruction from the switch control unit 430, the delay amount holding unit 441 outputs the amount of delay associated with the currently selected feedback path to the delay adding unit 442. The amount of delay that is output to the delay adding unit 442 becomes the initial value of the delay to be added to the transmission signal.

When the feedback path is switched by the switch 420, the delay adding unit 442 acquires the amount of delay associated with the currently selected feedback path from the delay amount holding unit 441 and adds the delay having the acquired amount of delay to the transmission signal. Namely, when the feedback path is switched, the delay adding unit 442 adds the amount of delay acquired from the delay amount holding unit 441 to the transmission signal as the initial value and outputs the delay transmission signal. After that, the delay adding unit 442 additionally adds the delay having the amount of delay notified from the averaging unit 202 to the transmission signal and outputs the delay transmission signal to the error calculating unit 113.

Furthermore, after the feedback path has been switched, and after elapse of a predetermined convergence period of time until the amount of delay notified from the averaging unit 202 stably converges, the delay adding unit 442 notifies the coefficient updating unit 114 of the update permission indicating permission to update the distortion compensation coefficient. Furthermore, because the distortion compensation coefficient that is updated by the coefficient updating unit 114 is the distortion compensation coefficient associated with the electrical power of the delay transmission signal, the delay adding unit 442 may also output the delay transmission signal to the coefficient updating unit 114.

In the second embodiment, the power amplifiers 140 are provided by being associated with the plurality of antennas and the FB signals that are output from the corresponding power amplifiers 140 are fed back by the feedback paths each having different propagation delay. Consequently, when a feedback path is switched by the switch 420, the delay added to the transmission signal is different. Thus, in the second embodiment, the amount of delay of the delay added to the transmission signal is stored for each feedback path and, when the feedback path is switched, the stored amount of delay is set in the delay adding unit 442 as the initial value. Consequently, it is possible to shorten the convergence period of time until the amount of delay calculated by the instantaneous delay discriminating unit 201 and the averaging unit 202 converges and it is thus possible to shorten the time taken to add, to the transmission signal, the delay corresponding to the propagation delay of the feedback path that is being selected.

Figure 9:
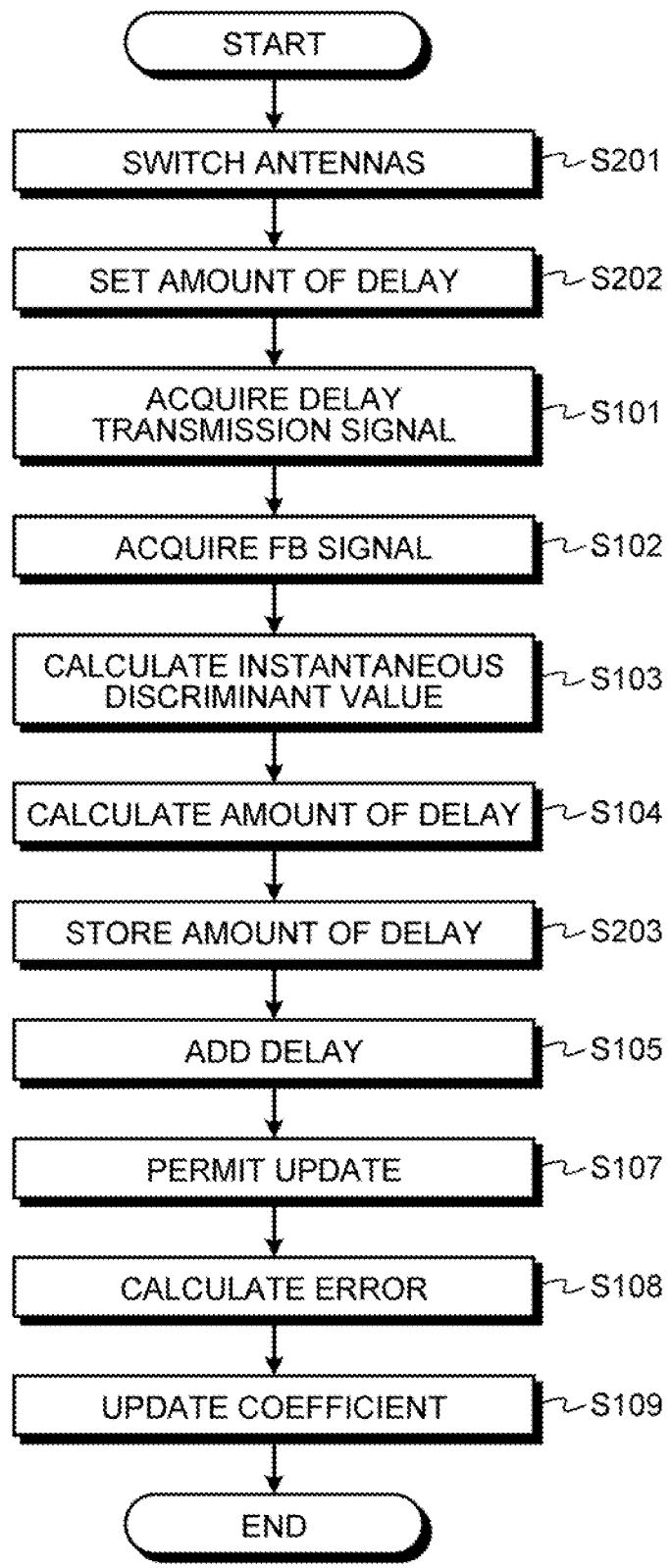
FIG. 9 is a flowchart illustrating a coefficient update method according to the second embodiment.

In the following, a coefficient update method performed in the wireless communication apparatus 100 having the configuration described above will be described with reference to the flowchart illustrated in FIG. 9. In FIG. 9, components that are the same as those illustrated in FIG. 6 are assigned the same reference numerals and descriptions thereof in detail will be omitted.

At the time of startup of the wireless communication apparatus 100 or at the time of periodical adjustment of delay, the feedback paths from the plurality of antennas are switched in time series by the switch 420 in accordance with control performed by the switch control unit 430 (Step S201). Namely, the FB signals from the plurality of feedback paths are output from the switch 420 every predetermined time and are input to the error calculating unit 113 and the delay adjusting unit 440.

When the feedback paths are switched, because the antenna instruction indicating which feedback path associated with an antenna is switched to is input from the switch control unit 430 to the delay amount holding unit 441, the amount of delay associated with the feedback path that is being selected is output to the delay adding unit 442 by the delay amount holding unit 441. Then, the amount of delay that is output from the delay amount holding unit 441 by the delay adding unit 442 is set to the initial value of the delay that is added to the transmission signal (Step S202). Consequently, even immediately after a switch in the feedback paths, a delay transmission signal in which delay that is close to the propagation delay of the FB signal in the currently selected feedback path is output by the delay adding unit 442. Then, the delay transmission signal is acquired by the instantaneous delay discriminating unit 201 (Step S101). Furthermore, in the initial state, because the amount of delay associated with the feedback path is not stored by the delay amount holding unit 441, the delay transmission signal equal to the transmission signal is acquired by the instantaneous delay discriminating unit 201.

Furthermore, when the transmission signal is subjected to distortion compensation by the distortion compensation unit 111 and is amplified power amplifiers 140 associated with the plurality of corresponding antennas, the FB signal that is fed back in the feedback path that is being selected by the switch 420 is acquired by the instantaneous delay discriminating unit 201 (Step S102).

Then, an instantaneous discriminant value is calculated from the sample of the delay transmission signal and the sample of the FB signals by the instantaneous delay discriminating unit 201 (Step S103). The instantaneous discriminant value is calculated by, similarly to the first embodiment, the configuration illustrated in, for example, FIG. 3. The calculated instantaneous discriminant value is accumulated by the averaging unit 202 and the mean value of the instantaneous discriminant values accumulated in a predetermined time period is calculated as an amount of delay (Step S104).

The calculated amount of delay is notified to the delay amount holding unit 441 and an amount of delay is associated with the currently selected feedback path and is stored by the delay amount holding unit 441 (Step S203). Furthermore, the amount of delay calculated by the averaging unit 202 is notified to the delay adding unit 442 and delay is added to the transmission signal by the delay adding unit 442 (Step S105).

When the delay having the amount of delay calculated by the instantaneous delay discriminating unit 201 and the averaging unit 202 is added to the transmission signal, the update permission indicating permission to update the distortion compensation coefficient is notified from the delay adding unit 442 to the coefficient updating unit 114 (Step S107). Consequently, after the update permission is notified, an update of the distortion compensation coefficient is performed by the coefficient updating unit 114. Namely, an error between the delay transmission signal and the FB signals is calculated by the error calculating unit 113 (Step S108) and a distortion compensation coefficient that reduces an error is calculated by the coefficient updating unit 114. This distortion compensation coefficient is stored in the LUT held by, for example, the distortion compensation unit 111 and an update of the distortion compensation coefficient is performed (Step S109).

After the update of the distortion compensation coefficient has been started, an amount of delay associated with each of the feedback paths is periodically calculated by the instantaneous delay discriminating unit 201 and the averaging unit 202. At this time, the initial value of the amount of delay that is set in the delay adding unit 442 is the amount of delay that is associated with each of the feedback paths and that is stored in the delay amount holding unit 441. Consequently, it is possible to shorten the convergence period of time until an amount of delay calculated by the instantaneous delay discriminating unit 201 and the averaging unit 202 converges.

As described above, according to the second embodiment, when power amplifiers associated with a plurality of antennas are provided, FB signals are fed back by switching the feedback paths from the corresponding power amplifiers in time series and an amount of delay to be added to the transmission signal is calculated. Then, the amount of delay corresponding to the propagation delay for each feedback path is associated with the feedback path and is stored. When the amount of delay related to the same feedback path is calculated next time, the stored amount of delay is added to the transmission signal as the initial value and an amount of delay is calculated from the delay transmission signal and the FB signals. Consequently, it is possible to add delay corresponding to propagation delay of each of the plurality of feedback paths to the transmission signal without performing correlation computation associated with the plurality of low-pass filters and it is thus possible to reduce an amount of computation at the time of adding delay to the signals. Furthermore, when an amount of delay corresponding to the propagation delay for each feedback path is periodically calculated, because the initial value of the set amount of delay is close to the actual amount of delay, it is possible to shorten the convergence period of time until the amount of delay to be calculated converges.

Figure 10:
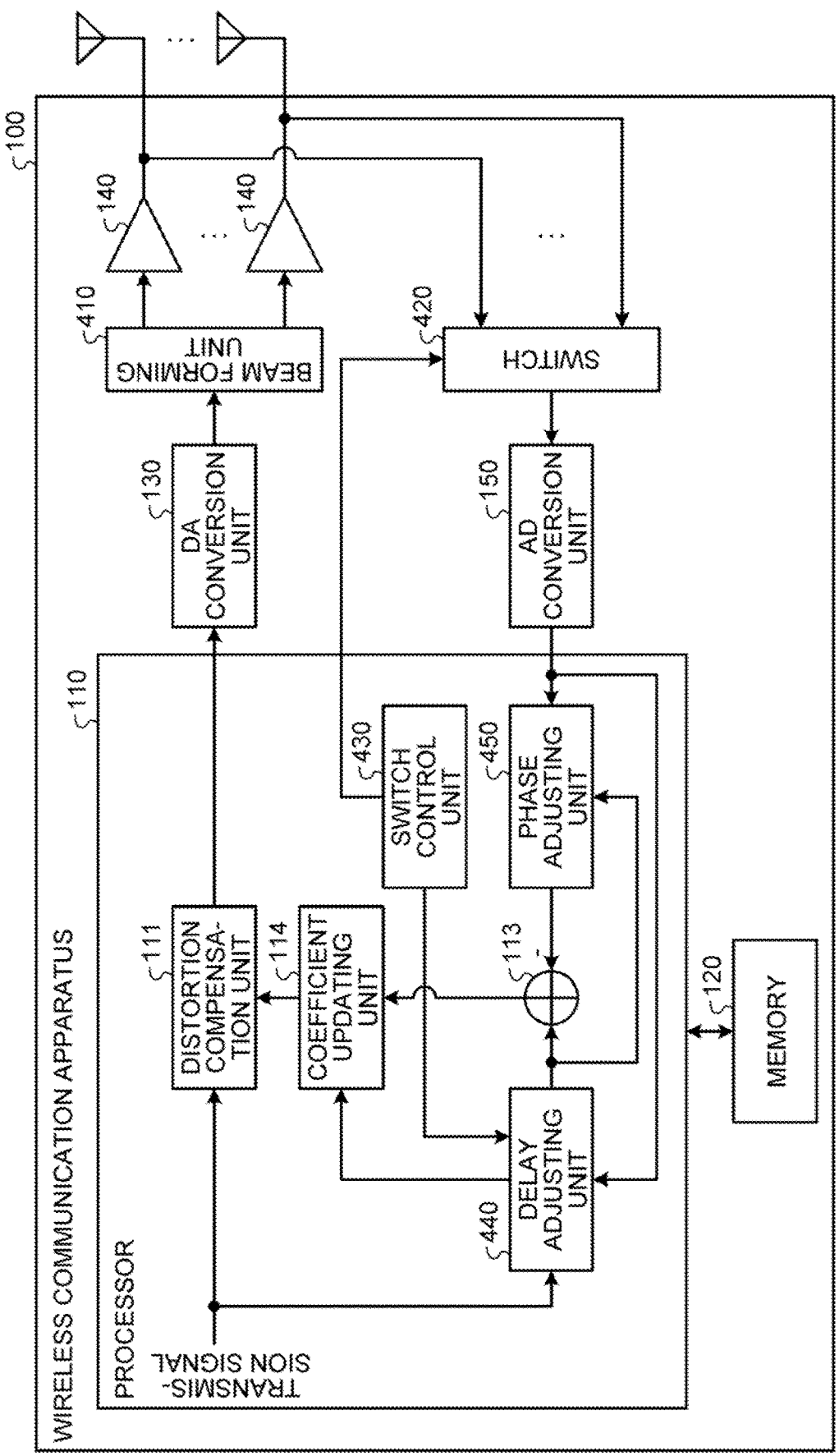
FIG. 10 is a block diagram illustrating a modification of the wireless communication apparatus.

Furthermore, in each of the embodiments described above, an error may also be calculated by the error calculating unit 113 after adjusting phase rotation of the delay transmission signal and the FB signals and aligning the phases of the delay transmission signal and the FB signals. FIG. 10 is a block diagram illustrating a modification of the wireless communication apparatus 100. In FIG. 10, components that are the same as those illustrated in FIGS. 1 and 7 are assigned the same reference numerals. The wireless communication apparatus 100 illustrated in FIG. 10 has a configuration in which a phase adjusting unit 450 is added to the wireless communication apparatus 100 illustrated in FIG. 7.

The phase adjusting unit 450 adds phase rotation to the FB signal by referring to the delay transmission signal that is output from the delay adjusting unit 440 and makes the phases of the delay transmission signal and the FB signal uniform. As the phase adjusting unit 450, for example, a phase locked loop (PLL) can be used. By making the phases of the delay transmission signal and the FB signal uniform, when an amount of delay is calculated based on only one of the in-phase (I) component and the quadrature (Q) component of each of the signals, it is possible to align the timings of the delay transmission signal and the FB signal. Consequently, it is possible to further reduce an amount of computation at the time of adding delay to the signal.

The phase adjusting unit 450 described above can be added to the wireless communication apparatus 100 (FIG. 1) according to the first embodiment. Furthermore, instead of the phase adjusting unit 450 that is a digital PLL included in the processor 110, an analog PLL circuit may also be provided in the upstream of the AD conversion unit 150.

According to an aspect of an embodiment of the wireless communication apparatus and the coefficient update method disclosed in the present invention, an advantage is provided in that it is possible to reduce an amount of computation at the time of adding delay to signals.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless communication apparatus comprising:
 a processor that performs distortion compensation on a transmission signal by using a distortion compensation coefficient;
 an amplifying unit that amplifies the transmission signal subjected to the distortion compensation by the processor; and
 a feedback path that feeds back a signal output from the amplifying unit to supply a feedback signal to the processor, wherein
 the processor executes a process comprising:
 acquiring, from a transmission signal at a first timing and feedback signals at a second timing that is before the first timing and at a third timing that is after the first timing, instantaneous delay associated with propagation delay of the feedback signals in the feedback path;
 calculating a mean value of the instantaneous delay acquired in a predetermined time period;
 adding delay associated with the calculated mean value to the transmission signal; and
 updating the distortion compensation coefficient by using the transmission signal to which the delay is added and the feedback signal.

2. The wireless communication apparatus according to claim 1, wherein the acquiring includes calculating an instantaneous discriminant value associated with the instantaneous delay based on positive/negative of the transmission signal at the first timing, positive/negative of the feedback signal at the second timing, and positive/negative of the feedback signal at the third timing.

3. The wireless communication apparatus according to claim 1, wherein the adding includes adding the delay to the transmission signal by performing interpolation on transmission signals at two adjacent clock timing.

4. The wireless communication apparatus according to claim 1, wherein
 the amplifying unit includes a plurality of amplifiers associated with a plurality of antennas,
 the feedback path includes
 a plurality of feedback paths that feeds back signals output from the plurality of corresponding amplifiers, and
 a switch that switches the plurality of feedback paths in time series and that sequentially supplies the feedback signals received from the plurality of corresponding feedback paths to the processor, and
 the processor further executes a process comprising
 storing an amount of delay associated with the mean value calculated at the calculating by associating the amount of delay with the feedback path switched by the switch.

5. The wireless communication apparatus according to claim 4, wherein the acquiring includes acquiring the instantaneous delay, when a feedback path is switched by the switch, from a delay transmission signal at the first timing to which a delay having an amount of delay stored in association with the feedback path is added and from the feedback signals at the second timing and the third timing.

6. The wireless communication apparatus according to claim 1, the processor further executes a process comprising
adjusting a phase of each of the transmission signal and the feedback signal, wherein
the updating includes updating the distortion compensation coefficient by using the transmission signal to which the delay is added and the feedback signal, the phase of the transmission signal and the feedback signal having been adjusted.

7. A coefficient update method comprising:
amplifying, performed by an amplifier, a transmission signal subjected to distortion compensation by using a distortion compensation coefficient;
feeding back, via a feedback path, a feedback signal output from the amplifier;
acquiring, from a transmission signal at a first timing and feedback signals at a second timing that is before the first timing and at a third timing that is after the first timing, instantaneous delay associated with propagation delay of the feedback signals in the feedback path;
calculating a mean value of the instantaneous delay acquired in a predetermined time period;
adding delay associated with the calculated mean value to the transmission signal; and
updating the distortion compensation coefficient by using the transmission signal to which the delay is added and the feedback signal.

\* \* \* \* \*